Dec. 8, 1964 E. W. MAHLAND 3,160,829
STARTING CIRCUIT FOR TRANSISTOR CONVERTER
Filed March 16, 1961
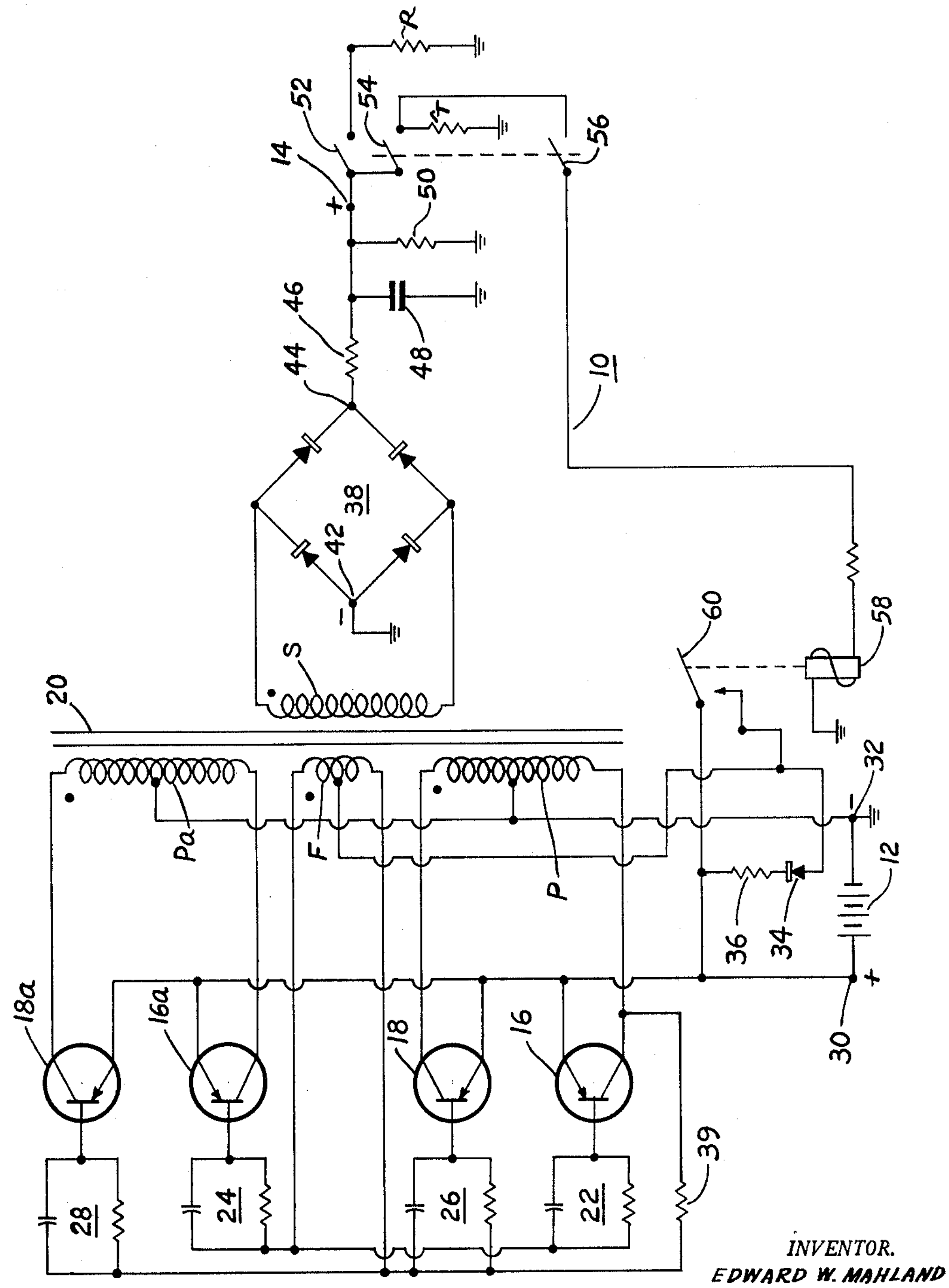
INVENTOR.
EDWARD W. MAHLAND
BY Morris Rabkin
ATTORNEY

United States Patent Office 3,160,829
Patented Dec. 8, 1964

3,160,829

STARTING CIRCUIT FOR TRANSISTOR CONVERTER

Edward W. Mahland, Ashland, N.J., assignor to Radio Corporation of America, a corporation of Delaware Filed Mar. 16, 1961, Ser. No. 96,205
7 Claims. (Cl. 331—113)

This invention relates generally to transistor oscillators, and more particularly to a transistor oscillator of the push-pull type. The transistor oscillator of the present invention is particularly useful in power supplies of the inverter type for converting a relatively low, unidirectional input voltage into a unidirectional output voltage of either relatively higher or relatively lower voltage.

Transistor oscillators of the push-pull type require an unbalance in either their circuitry or in the characteristics of their transistors to start oscillating. Once the push-pull transistor oscillator has started to oscillate, however, the unbalance is no longer required for continued operation. It has been proposed to provide positive starting for a transistorized push-pull oscillator by biasing the bases of the transistors from a tap on a voltage divider connected across the source of unidirectional input voltage. While such biasing means for providing self-starting are satisfactory in many cases, the voltage divider acts as a load on the input voltage, usually a battery, and switching means must be provided to disconnect the voltage divider from the voltage source when the oscillator is not oscillating. Also, such biasing means provide a constant bias current for all loads so that the oscillator efficiency varies with varying loads. In the event of a short-circuit of one of the resistors in the voltage divider, the bias current may become excessive and damage the transistors.

Accordingly, it is an object of the present invention to provide an improved push-pull transistor oscillator employing novel biasing means to insure a maximum safe current to the bases of the transistors, whereby to provide for positive starting of the oscillator.

Another object of the present invention is to provide an improved push-pull transistor oscillator employing novel biasing means that are not a load on the input voltage source when the oscillator is not oscillating.

Still another object of the present invention is to provide an improved push-pull transistor oscillator employing a diode that will act as a fuse if the base current of the transistors becomes excessive, thereby preventing excessive current from being drawn, which excessive current would result in very poor efficiency.

A further object of the present invention is to provide an improved transistor oscillator for a power supply employing novel means to vary the base current of the transistors to accommodate loads of different magnitudes efficiently.

Still a further object of the present invention is to provide an improved transistor oscillator that is simple in construction, easy to operate, and highly efficient in use.

In accordance with the invention, the transistor oscillator comprises a pair of transistors connected in push-pull relation. The primary winding of a transformer is connected between the emitter-collector paths of the transistors. A source of unidirectional input voltage is connected between a tap on the primary winding and the emitter-collector paths of the transistors. A first impedance is connected between the emitter-collector path of one transistor and the base of the other transistor. The ends of a feedback winding of the transformer are connected to the bases of the transistors, respectively, and a tap on the feedback winding is connected to the input voltage through a unidirectional device and a second impedance. The unidirectional device is poled in a direction to prevent current from flowing therethrough from the input voltage when the transistors are not oscillating. Means are also provided to short-circuit the unidirectional device and the second impedance to provide maximum, safe base current for the transistors when a heavy load is applied to the oscillator.

The novel features of the present invention, both as to its organization and method of operation, as well as additional objects and advantages thereof, will be more readily understood from the following description, when read in connection with the accompanying drawing, in which the single figure is a schematic diagram of a transistor oscillator, in an inverter power supply, in accordance with the present invention.

Referring, now, to the drawing, there is shown a power supply 10 of the inverter type for converting a relatively low unidirectional voltage, such as that from a battery 12, into a relatively high unidirectional output voltage between an output terminal 14 and a common terminal, such as ground. The power supply 10 is of the type used to convert the voltage of a battery in an automobile into a relatively high unidirectional voltage suitable for a mobile radio transmitter and receiver.

The power supply 10 comprises a pair of transistor oscillators connected in parallel to convert the D.-C. (direct-current) voltage of the battery 12 into an A.-C. (alternating-current) voltage. While a pair of transistor oscillators are shown and described herein, it will be understood that a single push-pull oscillator may be used if the output power requirements are relatively low. One push-pull oscillator, in accordance with the present invention, comprises the transistors 16 and 18, and the other push-pull oscillator, connected in parallel with the first push-pull oscillator, comprises the transistors 16*a* and 18*a*. The transistors 16, 18, 16*a*, and 18*a* are P–N–P transistors. It will be understood, however, that transistors of the opposite polarity type (NPN) may be used by providing biases of suitable polarity thereto in accordance with the practice well known in the art.

The collectors of the transistors 16 and 18 are connected to each other through one primary winding P of a transformer 20, and the collectors of the transistors 16*a* and 18*a* are connected to each other through another primary winding P*a* of the transformer 20. The winding P*a* is similar to the winding P and is inductively coupled thereto. One end of a feedback winding F of the transformer 20 is connected to the bases of the transistors 16 and 16*a* through similar R–C networks 22 and 24, respectively. The other end of the feedback winding F is connected to the bases of the transistors 18 and 18*a* through similar R–C networks 26 and 28, respectively. The emitters of the transistors 16, 18, 16*a*, and 18*a*, are connected to each other and to a positive input terminal 30.

The battery 12 is connected between the positive input terminal 30 (to which the positive terminal of the battery 12 is connected) and a negative input terminal 32. The negative input terminal 32 is connected to a common connection, such as ground. Center taps of the windings P and P*a* are connected to each other and to the negative input terminal 32. The center tap of the feedback winding F is connected to the positive input terminal 30 through a unidirectional device, such as a diode 34, and an impedance, such as a resistor 36. The diode 34 is poled in a direction to resist the flow of current therethrough from the battery 12. The collector of the transistor 16 is connected to the bases of the transistors 18 and 18*a* through a resistor 39 and the R-C networks 26 and 28, respectively.

The input terminals of a rectifier, such as a full-wave rectifier 38, are connected to the ends, respectively, of the secondary winding S of the transformer 20. The negative output terminal 42 of the full-wave rectifier 38 is connected directly to ground, and the positive output terminal 44 of the rectifier 38 is connected to the output terminal 14 of the power supply 10 through a resistor 46. A filter capacitor 48 and a bleeder resistor 50 therefor are connected in parallel between the output terminal 14 and ground.

The loads on the power supply 10 may comprise a radio receiver R and a radio transmitter T. The receiver R, indicated in the drawing by a resistor, is connected between the output terminal 14 and ground through a switch 52, and the transmitter T, also indicated in the drawing by a resistor, is connected between the output terminal 14 and ground through a switch 54. The switch 54 is ganged to, and connected in series with, a switch 56. The switch 56 is connected to ground through a relay 58. A normally open switch 60 is closed when the relay 58 is actuated. In its closed position, the switch 60 short circuits the diode 34 and the resistor 36.

Since the push-pull oscillator comprising the transistors 16 and 18 is similar to, and connected in parallel with, the push-pull oscillator comprising the transistors 16*a* and 18*a*, the operation of the former oscillator only will be described.

In operation, assume, first, that current from the battery 12 flows initially through the following path: the positive input terminal 30, the emitter-base path of transistor 18, the R-C network 26, the resistor 39, the lower half of the primary winding P, the negative input terminal 32, and back to the battery 12. Current increasing through the emitter-base path of the transistor 18 causes an amplified, increasing current to flow through the emitter-collector path of the transistor 18 and through the other (upper) half of the primary winding P. The latter current induces a voltage across the feedback winding F in a direction to cause the base of the transistor 18 to go more negative and the base of the transistor 16 to go more positive. This action causes the transistor 18 to saturate and the transistor 16 to remain cut off. Current through the emitter-base path of transistor 18 now flows through the R-C network 26, the lower half of the feedback winding F, the diode 34, the resistor 36, and back to the emitter of the transistor 18.

The resistor 39 has a value of resistance that permits a maximum current to flow initially through the emitter-base path of the transistor 18 to insure positive starting of the transistor oscillator. As current through the emitter-collector path of the transistor 18 reaches saturation, the rate of change of flux in the core of the transformer 20 approaches zero, and the voltage induced in the feedback winding F approaches zero. This action causes the current through the transistor 18 to decrease, whereby the flux in the core of the transformer 20 decreases. The latter change in flux causes a reversal of the previous polarities across the feedback winding F. This reversal in polarities causes the transistor 18 to become non-conductive and causes the transistor 16 to become conductive. The transistor 16 now conducts until it becomes saturated, and the cycle of operation is repeated. The frequency of oscillation of the push-pull transistor oscillator is a function primarily of the number of turns of the primary winding P. The R-C networks 22, 24, 26, and 28 provide suitable time constants for efficient operation of the oscillator.

The voltage across the primary winding P is transformed by the secondary winding S. The transformed voltage may be stepped up or down to any desired magnitude so that the rectified output voltage may have a desired value.

In ordinary use, the radio receiver R is normally a relatively light load on the power supply 10. The receiver R can be rendered operative by closing the switch 52. The radio transmitter T, however, is usually a relatively much heavier load on the power supply 10. To operate the radio transmitter T efficiently from the power supply 10, it is necessary to drive the transistors of the push-pull oscillators relatively harder. This is accomplished by decreasing the resistance in the emitter-base circuit of the transistors, as by short circuiting the diode 34 and the resistor 36 by means of the switch 60 of the relay 58. Thus, to operate the radio transmitter T, the ganged switches 54 and 56 are closed, whereby the relay 58 is actuated and the switch 60 is closed also. Under these conditions, more current flows in the emitter-base circuits of the transistors and causes currents of greater magnitude to flow through the primary windings P and P*a* of the transformer 20.

It will be noted that, if the oscillators were to fail to oscillate for any reason, current would not flow through the resistors 36 and 39 from the battery 12 because the diode 34 is poled in a direction to prevent current flow therethrough from the battery. If the resistor 36, for example, were to become shorted accidently during operation of the oscillators, thereby tending to cause too much current to flow in the emitter-base circuits of the transistors, the diode 34 would act as a fuse and burn out. This action opens the emitter-base circuits and prevents excessive current from being drawn from the battery 12.

From the foregoing descripiton, it will be apparent that there has been provided an improved transistor oscillator adapted for use in power supplies of the inverter type. While only one embodiment of the invention has been described and shown in diagrammatic form, variations in the circuitry coming within the spirit of this invention will, no doubt, readily suggest themselves to those skilled in the art. Hence, it is desired that the foregoing shall be considered as merely illustrative, and not in a limiting sense.

What is claimed is:

1. A transistor oscillator comprising a pair of transistors each having an emitter, a collector, and a base, a transformer comprising a primary winding and a feedback winding, means connecting the collectors of said transistors to each other through said primary winding, voltage applying means including a pair of terminals to energize said oscillator, one terminal of said pair of terminals being connected to said emitters, the other terminal of said pair of terminals being connected directly to a tap on said primary winding, means connecting the ends of said feedback winding to the bases of said pair of transistors, respectively, a first impedance, means connecting said first impedance between the collector of one of said transistors and the one of said ends of said feedback winding that is connected to the base of the other of said transistors, a unidirectional device, and a second impedance connected in series with said unidirectional device, said second impedance and said unidirectional device being connected in series between a tap on said feedback winding and said one terminal.

2. A transistor oscillator circuit, including as a minimum only a single pair of transistors, each of said transistors having an emitter, a collector and a base, a transformer having a first winding and a second winding inductively coupled to said first winding, said collectors of said pair of transistors being connected to each other through said first winding, means including a pair of terminals to apply a source of unidirectional voltage to said oscillator circuit, one of said pair of terminals being connected to said emitters, the other of said pair of terminals being connected to a tap on said first winding, a first resistor, means connecting the ends of said second winding to the bases of said pair of transistors, respectively, means connecting said first resistor between the collector of one of said pair of transistors and the junction of said means connecting the base of the other of said pair of transistors to one of said ends of said second winding, a diode, and a second resistor, a tap on said second winding being connected to said one terminal through said diode and said second resistor, and said diode being poled in a direction to prevent current from said voltage source from flowing therethrough when said voltage source is connected between said pair of terminals.

3. A power supply comprising a push-pull oscillator, said oscillator comprising a pair of transistors each having an emitter-collector path and a base, a transformer having a primary winding, a feedback winding, and a secondary winding, means connecting said emitter-collector paths of said transistors to each other through said primary winding, voltage applying means including a pair of terminals to apply a source of unidirectional voltage to said oscillator, one terminal of said pair of terminals being connected to the emitters of said emitter-collector paths of said transistors, the other terminal of said pair of terminals being connected directly to a tap on said primary winding, means connecting the ends of said feedback winding to said bases of said pair of transistors, respectively, a first impedance, said first impedance being connected between (*a*) the junction of said primary winding and said emitter-collector path of one transistor of said pair of transistors and (*b*) the junction of one of said ends of said feedback winding and said means connecting said one end to the base of the other transistor of said pair of transistors, a unidirectional device having an anode and a cathode, said anode being connected to a tap on said feedback winding, a second impedance, said cathode being connected to said one terminal through said second impedance, and means connected to the ends of said secondary winding to apply a load thereacross.

4. A power supply comprising at least one push-pull oscillator, said oscillator comprising only two transistors each having an emitter-collector path and a base, a transformer comprising a primary winding, a secondary winding, and a feedback winding, means connecting said emitter-collector paths to each other through said primary winding, means connecting the ends of said feedback winding to said bases of said transistors, respectively, a pair of input terminals for a source of unidirectional voltage to energize said oscillator, one of said terminals being connected to each of said emitter-collector paths of said two transistors, the other of said terminals being connected directly to a tap on said primary winding, a first impedance, said first impedance having one end connected directly to the junction between said emitter-collector path of one of said transistors and said primary winding, the other end of said first impedance being connected directly to the junction between one of said ends of said feedback winding and said means connecting the base of the other of said transistors to said one end of said feedback winding, a diode having two terminals, one of said terminals of said diode being connected directly to a tap on said feedback winding, an ohmic resistance connecting the other terminal of said diode to said one terminal, and means connected to the ends of said secondary winding for applying a load therebetween.

5. In combination, a plurality of push-pull oscillators connected in parallel, each of said oscillators comprising a pair of transistors only, each of said transistors having an emitter-collector path and a base, a transformer having a plurality of primary windings, separate primary windings for each pair of said transistors, and one feedback winding, means connecting the emitter-collector paths of each of said pair of transistors to each other through a separate one of said primary windings, respectively, voltage applying means including a pair of terminals to energize said oscillators, one of said pair of terminals being connected to each of said emitter-collector paths of each of said pairs of transistors in each of said oscillators, the other of said pair of terminals being connected directly to a tap on each of said primary windings, means connecting the ends of said feedback winding to the bases of each of said transistors in each of said pairs of transistors, respectively, a first impedance, means connecting said first impedance directly between (*a*) the junction of one of said primary windings and the emitter-collector path of one of said transistors and (*b*) the junction of the means connecting the base of the other transistor paired with the last-mentioned transistor and one end of said feedback winding, a unidirectional device and a second impedance connected in series, and means connecting said serially connected unidirectional device and said second impedance in series between a tap on said feedback winding and said one terminal of said voltage applying means.

6. In combination, a transistor oscillator comprising only two transistors and adapted to be connected in parallel with similar transistor oscillators, each of said transistors having an input electrode, an output electrode, and a common electrode, a pair of terminals for applying a voltage to said oscillator, a transformer having a primary winding and a feedback winding, means connecting said output electrodes to each other through said primary winding, a tap on said primary winding being connected to one of said terminals, said common electrodes being connected to the other of said terminals, means connecting opposite ends of said feedback winding to said input electrodes of the respective said transistors, a first impedance, means connecting said first impedance directly between (*a*) the output electrode of one of said transistors and (*b*) the junction of one end of said feedback winding and said means connecting said one end to the input electrode of the other of said transistors, a circuit consisting of a second impedance and a diode connected in series with each other, and means connecting said circuit between a tap on said feedback winding and said other terminal.

7. In combination, a plurality of push-pull oscillators, each of said oscillators comprising a pair of transistors only, each of said transistors having an input electrode, and output electrode, and a common electrode, a pair of terminals for applying a source of unidirectional voltage to said oscillators, a transformer having separate primary windings, one for each pair of said transistors, respectively, a feedback winding, and a secondary winding, means connecting said output electrodes in each of said pair of transistors to each other through a separate one of said primary windings, respectively, a tap on each of said primary windings being connected to one of said terminals, means connecting opposite ends of said feedback winding to said input electrodes in each of said pairs of transistors, a first impedance, means connecting said first impedance between (*a*) the output electrode of one of said transistors and (*b*) the junction between one of said ends of said feedback winding and said means connecting said input electrode of the other transistor paired with said one transistor, a diode having two terminals, means connecting one terminal of said diode to a tap on said feedback winding, an ohmic resistance connecting the other terminal of said diode to each of said common electrodes, means to connect the load across said secondary winding, a relay including a switch connected in parallel with said diode and said ohmic resistance and adapted to short circuit said diode and said ohmic resistance when said relay is actuated, and means to actuate said relay when said load is relatively heavy.

References Cited in the file of this patent

UNITED STATES PATENTS

| | | |
|---|---|---|
| 2,964,717 | Carstedt et al. | Dec. 13, 1960 |
| 2,990,517 | Grieg | June 27, 1961 |
| 3,009,115 | Johnson | Nov. 14, 1961 |
| 3,020,491 | Kurtz | Feb. 6, 1962 |
| 3,040,271 | Murphy et al. | June 19, 1962 |
| 3,046,495 | Faries et al. | July 24, 1962 |